United States Patent [19]

LaDelfe et al.

[11] Patent Number: 4,595,832

[45] Date of Patent: Jun. 17, 1986

[54] THERMAL SENSOR WITH AN IMPROVED COATING

[75] Inventors: Peter C. LaDelfe; Suzanne C. Stotlar, both of Los Alamos, N. Mex.

[73] Assignee: The United States of America as represented by the United States Department of Energy, Washington, D.C.

[21] Appl. No.: 595,204

[22] Filed: Mar. 30, 1984

[51] Int. Cl.[4] .................................................. G01J 1/00
[52] U.S. Cl. ....................................... 250/338; 250/353
[58] Field of Search .............. 250/338 R, 338 PY, 353

[56] References Cited

U.S. PATENT DOCUMENTS 4,384,207 5/1983 Doctor ........................... 250/338 PY
4,469,943 9/1984 Turnbull ........................ 250/338 PY

OTHER PUBLICATIONS

Peterson et al., "Analysis of Response of Pyroelectric Optical Detectors," J. Appl. Phys. 45, 3296 (1974).
Silberg, "Infrared Absorption of Three-Layer Films," J. Opt. Soc. Am. 47, 575, (1957).
Annis et al., "Absorption of Radiation in PLZT Pyroelectric Detectors," Infrared Phys. 14, 199 (1974).
Hilsum, "Infrared Absorption of Thin Metal Films," J. Opt. Soc. Am. 44, 188 (1954).
Hadley et al., "Reflection and Transmission Interference Filters," J. Opt. Soc. Am. 37, 451 (1947), 38 483 (1948).
Harrick et al., "A Thin Film Optical Cavity to Induce Absorption or Thermal Emission," Appl. Opt. 9, 2111 (1970).
Roundy et al. "Subnanosecond Pyroelectric Detector," Appl. Phys. Lett. 21, 512 (1972).

Primary Examiner—Janice A. Howell
Attorney, Agent, or Firm—Lee W. Huffman; Paul D. Gaetjens; Judson R. Hightower

[57] ABSTRACT

The disclosure is directed to an apparatus for detecting radiation having wavelengths from about 0.4 $\mu$m to about 5.6 $\mu$m. An optical coating is applied to a thermal sensor that is normally transparent to radiation with such wavelengths. The optical coating is thin and light and includes a modifier and an absorber. The thermal sensor can be a pyroelectric detector such as strontium barium niobate.

6 Claims, 6 Drawing Figures

THERMAL SENSOR WITH AN IMPROVED COATING

This invention is the result of a contract with the Department of Energy (Contract No. W-7405-ENG-36).

BACKGROUND OF THE INVENTION

The invention described herein relates generally to structures for detecting radiation and to optical coatings for use with the structures. The invention relates more particularly to pyroelectric detectors capable of detecting visible and near-infrared fast laser pulses and to optical coatings for use with the detectors.

High speed, improved response pyroelectric sensors are used in high flux, high speed applications in the infrared and ultraviolet. The materials suitable for use in such devices need to be rugged, nonhygroscopic and sensitive. These include strontium barium niobate (hereafter SBN), lanthanum-doped lead titanate zirconate (hereafter PLZT), lithium tantalate, and lithium niobate. Other pyroelectric materials exhibit too low a sensitivity or Curie temperature and thus depole or are environmentally unstable. Unfortunately, these desirable materials are transparent and therefore unresponsive in the visible and near-infrared (ir). The ruggedness and speed of these sensors cannot be utilized for wavelengths in the 0.4 to 5.6 $\mu$m region. This eliminates use with dye lasers (for most dyes), YAG, carbon monoxide, glass and other lasers which emit visible and near-ir. There are numerous applications in this region, including free electron lasers. Moreover, most pulsed laser applications in the field are in this region. Consequently, a high speed, rugged pyroelectric sensor would be highly useful.

Methods for inducing response at these wavelengths have been limited to doping, which generally affects material parameters, or applying an absorbing coating on either or both faces of the sensor. Gold black and cermets have been used. Gold black is fragile to the touch and these coatings tend to be very thick. They increase the thermal time constant of the sensor since they absorb the maximum energy, become hot and slowly release the heat into the sensor. These coatings result in slow devices which are not useful for speeds beyond about 50 kHz.

Coating with a metallic layer has not been used because of high indices of refraction and the thickness required for total absorption. A three layer coating has been applied to a PLZT detector. A. D. Annis and G. Simpson, "Absorption of Radiation in PLZT Pyroelectric Detectors," Infrared Phys., Vol. 14, pp. 199–205, 1974. This coating consists of a dielectric layer sandwiched between two metal layers. They achieved greater than 95% absorptance. The coating was, however, thick and slow.

SUMMARY OF THE INVENTION

One object of the present invention is to provide an optical coating that will increase the sensor's sensitivity to radiation of wavelengths for which the sensor material exhibits low absorptivity.

Another object of the invention is to detect radiation having a wavelength from 0.4 $\mu$m to 5.6 $\mu$m with a thermal sensor.

Still another object of the invention is to coat a thermal sensor with optical coating that is thin and light.

Another object of the invention is to provide for an optical coating that places a sufficiently small thermal load on a pyroelectric detector so that the detector has a fast response time.

To achieve the foregoing and other objects, and in accordance with the purposes of the present invention, as embodied and broadly described herein, there is provided an apparatus for detecting radiation with an improved optical coating. The apparatus is capable of detecting radiation having wavelengths from about 0.4 $\mu$m to about 5.6 $\mu$m and comprises a thermal sensing means having top and bottom surfaces and opposed first and second sides. The thermal sensing means generates an electrical signal between a pair of electrodes in response to impinging radiation. A first electrode is disposed on the first side and a second electrode is disposed on the second side. The impinging radiation is directed toward the top surface. An optical coating is disposed on the top surface. The optical coating includes a first modifier and a first absorber. The first modifier is located above the first absorber.

In another embodiment of the invention, the optical coating is disposed on the first electrode, the first electrode is disposed on the top surface and the second electrode is disposed on the bottom surface. A second absorber can be located beneath and secured to the bottom surface. A second modifier can be located beneath and secured to the thermal sensing means and a power dump can be located beneath the second modifier. The optical coating has a mass of less than 100 $\mu$g/cm$^2$ and can have a mass of less than 25 $\mu$g/cm$^2$. The optical coating places a sufficiently small thermal load on the thermal sensing means that it has a response time of between one nanosecond and one hundred picoseconds. The first modifier is an anti-reflector. The first absorber is a metal such as iron. The thermal sensing means is a pyroelectric detector such as SBN and the first modifier can be cadmium telluride. The optical coating has a thickness of less than 2000 Å. Preferably, it has a thickness of less than 400 Å. The first and second absorbers can be partial absorbers.

One advantage of the present invention is that narrow or broadband selective absorption can be obtained.

Another advantage is that high speed laser pulses (at least 50 MHz) in the visible and near-ir can be detected and characterized.

Still another advantage is that an optical coating can be used to control the absorptance, reflectance and transmission of the sensor.

Another advantage is that a sufficiently small thermal load is placed on the thermal sensing means by the optical coating that the thermal sensor has a response time of less than one nanosecond.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 2:
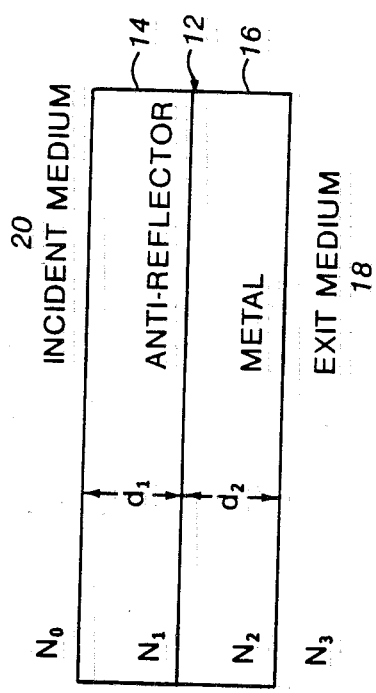
FIG. 2 schematically illustrates an embodiment of the optical coating.
Figure 1:
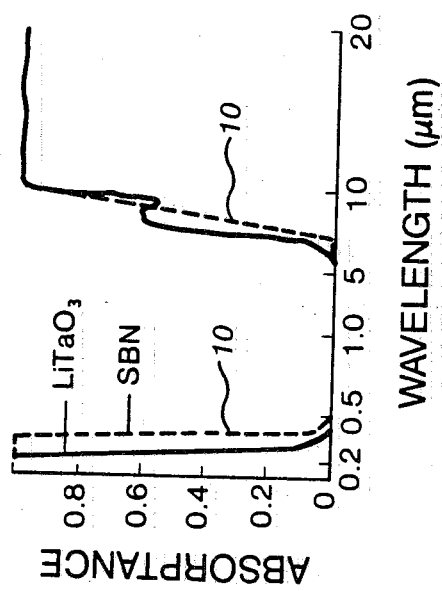
FIG. 1 graphically illustrates the absorptance of SBN and LiTaO$_3$ as a function of wavelength.

Reference is now made to FIG. 1 which shows the absorptance of ¼ mm thick crystals of SBN and LiTaO$_3$ as a function of wavelength. As can be seen in FIG. 1, the absorptance for SBN, shown in broken line 10, is zero from about 0.4 μm to about 7 μm. FIG. 2 shows an optical coating 12 in which a modifier 14 is disposed on an absorber 16. The modifier 14 is an anti-reflector and the absorber 16 is a metal. The thickness of the modifier 14 is shown as d$_1$, and its refractive index is N$_1$. The refractive index of the absorber 16 is N$_2$ and its thickness is shown as d$_2$. When the optical coating 12 is applied to a thermal sensor, the refractive index N$_3$ of the exit medium 18 is that of the sensor material. The incident medium 20 is usually air, with refractive index N$_0$.

Figure 3:
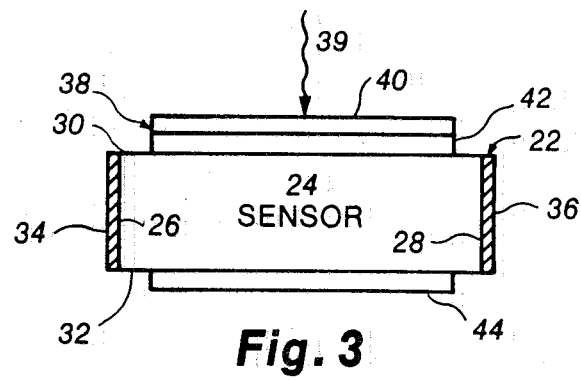
FIG. 3 shows a cross sectional view of a preferred embodiment of the invention.

FIG. 3 shows a cross sectional view of a preferred embodiment of the invention. The apparatus 22, in accordance with the present invention, includes a thermal sensor 24 having a first side 26, a second side 28, a top surface 30 and a bottom surface 32. First electrode 34 is disposed on first side 26 and second electrode 36 is disposed on second side 28. An optical coating 38 is disposed on top surface 30. The optical coating 38 includes a first modifier 40 and a first absorber 42. The first modifier 40 is shown on top of the first absorber 42, but their positions can be reversed. Preferably, the optical coating 38 has a mass of less than 100 μg/cm$^2$ and places a sufficiently small thermal load on thermal sensor 24 that thermal sensor 24 has a response time of less than one nanosecond. The first absorber 42 can be a metal and it can be a partial absorber. Thermal sensor 24 is preferably a pyroelectric detector such as SBN, first absorber 42 can be iron and first modifier 40 can be cadmium telluride.

The apparatus 22 can include a second absorber 44 disposed on bottom surface 32. Second absorber 44 can be a partial absorber. Optical coating 38 has a thickness of less than 2000 Å. Preferably it has a thickness of less than 400 Å.

First modifier 40 can contain one or more layers of nonabsorbing material. It can be an anti-reflector, a reflector or a spectral selector. An anti-reflector reduces the reflectance of optical coating 38 and increases the absorptance and transmittance of first absorber 42. Using a reflector for the first modifier 40 increases the reflectance and decreases the absorptance and transmittance. Using a spectral selector allows the absorptance to be varied radically over narrow spectral bands.

These coatings are designed in the same manner as any other optical interference coating. A design is assumed, and its spectral performance is analyzed using the characteristic matrix method. A description of this method may be found in Thin Film Optical Filters, H. A. Macleod, Eds. (American Elsevier, New York, 1969), Chapter 2. The design is then modified until the calculated response matches the desired result. The coatings can be used with any type of thermal sensor, including bolometers, thermopiles and Golay cells.

The simplest class of these coatings is the thin variable absorber with an anti-reflection layer to couple the energy into the absorber. A reasonably wide bandwidth is obtained if a metal having a low intrinsic reflectivity is selected. A high variability of the absorptance is obtained by then using a high index of refraction material for the single layer modifier (e.g., iron and cadmium telluride at 1.06 μm). The adjustment in absorptance, transmittance and reflectance is then obtained by varying the thickness of these two layers. A broader bandwidth may be achieved by using a multi-layer anti-reflector.

A moderate wavelength selectivity may be achieved by using a highly reflective metal. Acceptable anti-reflection can then be obtained only by using multi-layer anti-reflection coatings having a symmetrical arrangement of an odd number of layers such that it has a high Herpin equivalent admittance. Such a coating would be more massive than the single layer anti-reflector.

More radical wavelength selectivity can be achieved by constructing a Fabry-Perot filter. This is done by using a highly reflective metal as the absorber and one reflector. A spacer layer is deposited on top of the metal followed by the second reflector which may be either another metallic layer or a dielectric stack. The absorptance and in-band reflectance may be varied by mismatching the reflectors.

The reflective modifier coating is simply a dielectric stack on top of the absorber. It is included here only for completeness since in most applications the same result is achieved more efficiently by using a more reflective metal.

Figure 4:
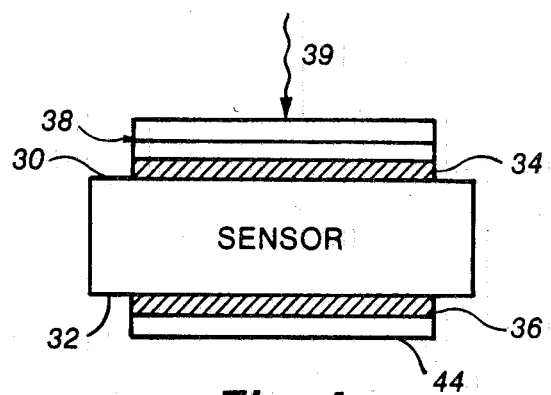
FIG. 4 shows a cross sectional view of another embodiment of the invention.

FIG. 4 illustrates another embodiment of the invention. The differences between the FIG. 4 embodiment and that of FIG. 3 are that in FIG. 4 first electrode 34 is disposed on top surface 30 and second electrode 36 is disposed on bottom surface 32. Also, optical coating 38 is disposed on first electrode 34 in FIG. 4 and second absorber 44 is disposed on second electrode 36. This arrangement is known as a face-type detector since the incident radiation 39 passes through the electrodes 34 and 36.

Figure 5:
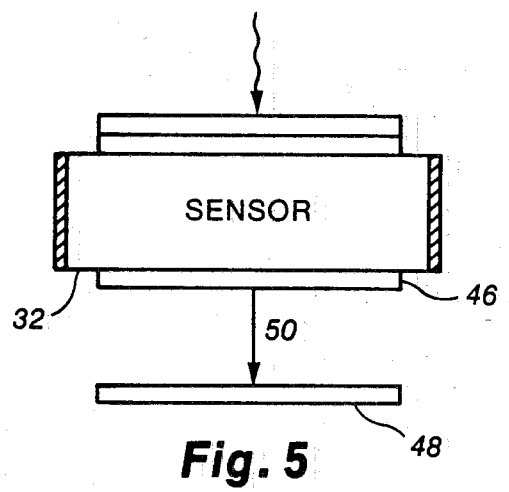
FIG. 5 shows a cross sectional view of yet another embodiment of the invention.

FIG. 5 illustrates another embodiment of the invention. The differences between the FIG. 5 embodiment and that of FIG. 3 are that a second modifier 46 is disposed on bottom surface 32 and a power dump 48 is located beneath second modifier 46. This embodiment is used in very high power applications and power dump 48 receives energy from second modifier 46 as shown by arrow 50.

A prototype apparatus 22 was assembled which had a single modifier of cadmium telluride (671 Å) on a partial absorber of iron (600 Å) to demonstrate maximum absorptivity possible with even a simplified case. The coating was designed to handle 1.06 μm most effectively. CdTe and Fe were used because of availability, ruggedness, and compatibility with the sensor material and design considerations. Although by no means a unique combination, they fit the requirements well.

Figure 6:
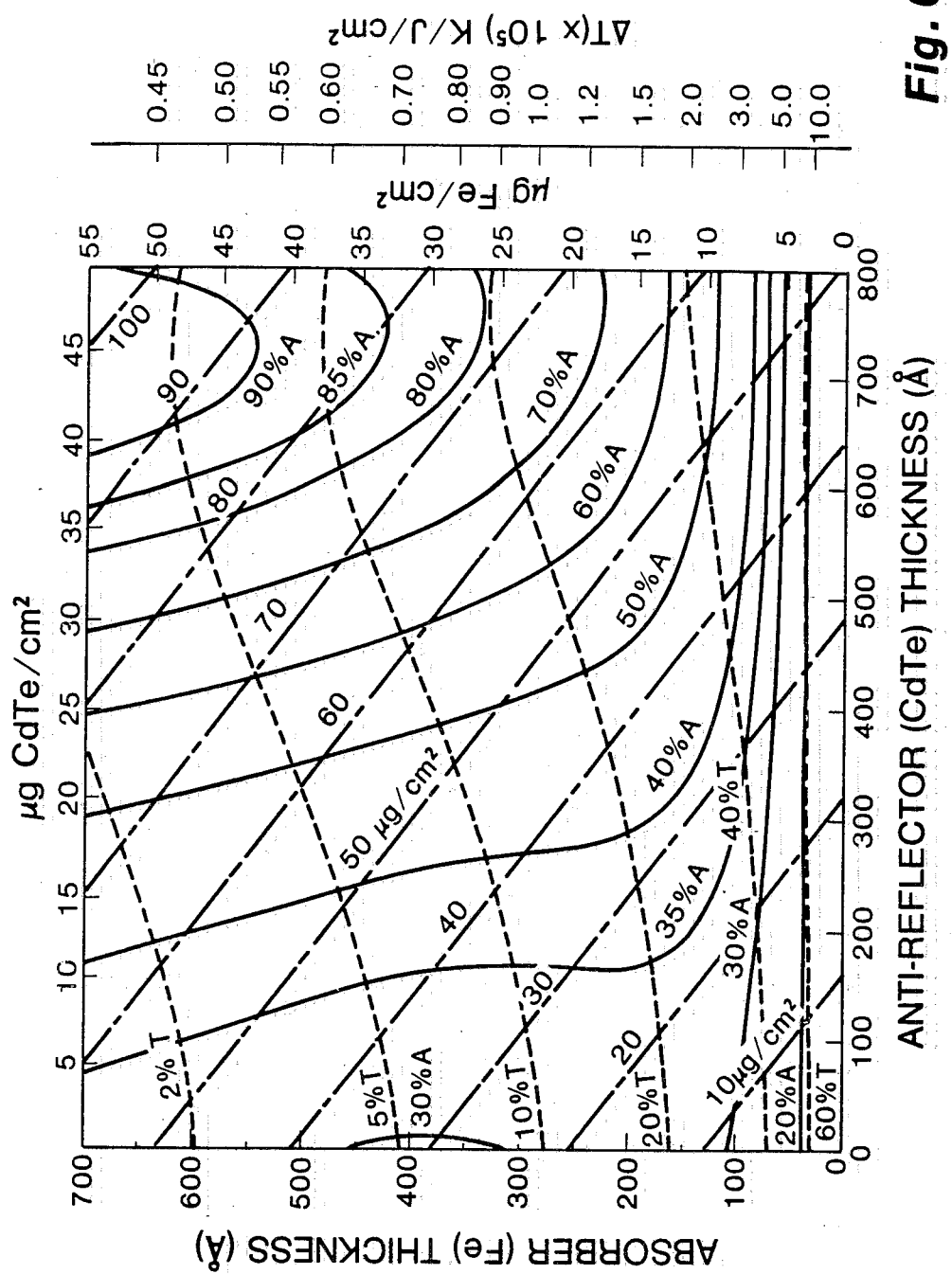
FIG. 6 graphically illustrates a topography of results which can be obtained using iron (absorber) and cadmium telluride (modifier) on the entrance face of an SBN thermal sensor. Contours of constant absorptance, transmittance and mass are plotted as functions of the thickness of the Fe and CdTe layers.

FIG. 6 shows the topography of results which can be obtained using the iron/cadmium telluride system on the entrance face of an SBN detector. Contours of constant absorptance, transmittance, and mass are plotted as functions of the thickness of the Fe and CdTe layers. A scale showing the temperature rise per unit energy resident in the absorber layer is also shown. FIG. 6 indicates the variability available to the designer and the necessity to design the absorber for the particular application. The design should be based on a consideration of the following factors.

1. Minimum acceptable absorptance.
2. Maximum acceptable total mass.
3. Disposition of the unabsorbed energy. There is considerable choice in having the energy which is not absorbed either transmitted into the detector or reflected away.
4. Incident power and damage. An absorber coating invariably has a low damage threshold. The primary damage mechanism is related to the temperature rise of the coating. If high incident power is expected, the risk of damage can be reduced by using a thicker absorber layer per unit absorptance.

One additional option available to the designer is to place coatings on both the entrance and exit faces of the detector. The premise here is that two very thin coatings should not slow the detector any more than one. The coating on the entrance face should be designed so as to absorb only part of the incident energy and to transmit as much of the remainder as the constraints on total mass allow. The exit face coating should then absorb as much energy as possible without slowing the detector further.

The exit face coating could be a two layer coating. For most applications it is more reasonable to use just an iron layer in order to minimize mass.

Using six members of the Fe/CdTe system, twelve detectors were fabricated on Sr$_{0.5}$ Ba$_{0.5}$Nb$_2$O$_6$ (50/50 SBN) as described in the table. The chips were 3 mm×3 mm×0.25 mm, polished, with 2 mm diameter coatings. The coatings were applied by electron beam deposition monitored with a quartz crystal oscillator, accurate within 5% of total thickness. Glass witness samples (22 mm diameter) were coated concurrently. The coatings were examined with a metallurgical microscope and determined to be free of observable pinholes and non uniformities. The absorptance of the coatings on glass was calculated and measured as shown in the table. Calculated values of the absorptance on SBN are given due to the lack of a sufficiently large diameter piece of SBN to make the measurement. The coatings could be cleaned without scratching and appeared to be relatively hard.

TABLE

| Sample Number | | 1 | 2 | 3 | 4 | 5 | 6 | 7 |
|---|---|---|---|---|---|---|---|---|
| Indicated thickness (angstroms) | CdTe | 109 | 116 | 0 | 368 | 609 | 600 | 0 |
| | Fe | 77 | 141 | 506 | 506 | 149 | 518 | 0 |
| ABS. on Glass | calculated | .39 | .42 | .32 | .53 | .61 | .82 | NA |
| | measured | .36 | .40 | .31 | .57 | .54 | .86 | NA |
| ABS. on SBN | calculated | .28 | .33 | .30 | .52 | .53 | .81 | 0 |
| Falltime (TDR) (picoseconds) | measured | 145 | 175 | 92 | 113 | 211 | 113 | 92 |
| Voltage Responsivity (V/MW, 50Ω, 1.06 μm, 15 ns) | calculated | 1.5 | 1.6 | 1.5 | 2.5 | 2.6 | 4.0 | 0 |
| | measured | 1.2 | 1.5 | 1.1 | 1.7 | 2.1 | 2.8 | 0 |

After coating, the chips were mounted in the edge-type manner onto SMA/SMA connectors and impedance matched to 50Ω. After mounting, the detectors were poled. A Tektronix 7S12 TDR (time domain reflectometer) plug-in and a 7000 series oscilloscope were used to evaluate the electrical RC time constant of the coated detectors and compare it with an uncoated detector. For fast devices the RC time constant as measured by the TDR sampler is most closely related to the falltime, the risetime being inductance limited (generally faster). The speed with which a signal can be extracted electrically from the detector provides a lower limit on the response time. A comparison of the average falltime of the coated detectors with the uncoated detectors can be found in the table.

A Tektronix 7D20 Programmable Digitizer plug-in with a 7000 series mainframe was used to evaluate the response of the detectors (a 50Ω termination was added to achieve fast response.) The risetime of the plug-in was 3.3 ns. The smoothed response of a coated SBN detector to 15 ns FWHM 1.06 μm pulses at 10 Hz from a Quanta-Ray DCR Nd:YAG laser was compared to the response of a fast photodiode. Neutral density filters were used to reduce the energy incident on the detectors. Scientech and Coherent power meters were used to make independent energy measurements.

The current responsivity of a pyroelectric detector can be calculated from $$R_I = \frac{\eta \lambda_p(T)}{sC_p l}$$

where $\lambda_p(T)$ is the pyroelectric coefficient (usually at room temperature), s the density, $C_p$ the specific heat, and l the electrode separation. The emissivity is a lumped constant affected by how the chip is mounted and other factors. However, the absorption is usually taken as $\eta$.

The voltage responsivity for fast pulses is $$R_V = R_L R_I$$

where $R_L$ is the effective load resistance, here 50Ω.

Using the calculated values of absorption and standard values of $C_p$, s, and $\lambda_p$ reported in the literature for 50/50 SBN, a calculated value of the voltage response into 50Ω is shown in the table.

The table summarizes the absorption of the sample coatings on glass and SBN, the TDR-measured falltime of the finished detectors, and calculated and measured voltage responsivity. The TDR falltime results imply that a thick layer of iron (500 Å) results in a fast electrical response.

The displayed FWHM of a square wave 15 ns pulse into a 3.3 ns rise and falltime system would be 18.3 ns. While the data is still preliminary, the implication is that the risetime of the coated detectors, even group 5, is less than one nanosecond. No measurable difference in the time response of groups 1–6 was apparent.

Pyroelectric detectors have a detectivity significantly below that of a silicon photodiode. For this laser operating at a moderate output power, a neutral density of 7 to 9 was necessary to keep the photodiode from saturating. The laser output was nonuniform and the spot contained numerous hot spots where the intensity varied by a factor of 3 to 10. As a result, the coatings could be damaged. While the damage threshold of the coatings was not measured due to the poor quality of the intensity distribution, it was empirically observed that the damage threshold was about an order of magnitude below that of the material 150 mJ/cm$^2$ for 1 ns CO$^2$ laser pulses). This would imply that the maximum voltage output into 50Ω for a 3 mm electrode separation detector with a 2 mm diameter coating would be a few hundred millivolts. Detectors could be designed for greater output.

The foregoing description of several embodiments of the invention has been presented for purposes of illustration and description. It is not intended to be exhaustive or to limit the invention to the precise forms disclosed. They were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for detecting electromagnetic radiation in the form of high speed laser pulses of at least 50 MHz, the radiation having wavelengths from about 0.4 μm to about 5.6 μm, said apparatus comprising:
   a. a pyroelectric thermal sensing means for generating an electrical signal in response to impinging radiation, said thermal sensing means having a top and a bottom surface, said impinging radiation being directed toward said top surface;
   b. a first electrode for receiving and conducting electrical charges generated on said top surface of said thermal sensing means, said first electrode being disposed on said top surface;
   c. A second electrode for receiving and conducting electrical charges generated on said bottom surface of said thermal sensing means, said second electrode being disposed on said bottom surface; and
   d. an optical coating for increasing the absorption of the impinging radiation, said optical coating including a first metallic layer disposed on said first electrode, and a first anti-reflector disposed on said first metallic layer, said optical coating having a thickness of less than 2000 Å and a mass of less than 100 μg/cm$^2$, said optical coating placing a sufficiently small thermal load on said sensing means that said sensing means has a response time of less than one nanosecond.

2. The invention of claim 1 further comprising a second metallic layer disposed on said second electrode.

3. An apparatus for detecting electromagnetic radiation in the form of high speed laser pulses of at least 50 MHz, the radiation having wavelengths from about 0.4 μm to about 5.6 μm, said apparatus comprising:
   a. a pyroelectric thermal sensing means for generating an electrical signal in response to impinging radiation, said thermal sensing means having a top and a bottom surface and opposed first and second sides, said impinging radiation being directed toward said top surface;
   b. a first electrode for receiving and conducting electrical charges generated on said first side of said thermal sensing means, said first electrode being disposed on said first side;
   c. a second electrode for receiving and conducting electrical charges generated on said second side of said thermal sensing means, said second electrode being disposed on said second side; and
   d. an optical coating for increasing the absorption of the impinging radiation, said optical coating including a first metallic layer disposed on said top surface and an anti-reflector disposed on said first metallic layer, said optical coating having a thickness of less than 2000 Å and a mass of less than 100 μg/cm$^2$, said optical coating placing a sufficiently small thermal load on said sensing means that said sensing means has a response time of less than one nanosecond.

4. The invention of claim 3 further comprising a second metallic layer located beneath and secured to said bottom surface.

5. The invention of claim 3 wherein said optical coating has a mass of less than 25 μg/cm$^2$.

6. The invention of claim 3 wherein said optical coating has a thickness of less than 400 Å.

* * * * *